United States Patent [19]

Pecukonis

[11] Patent Number: 4,642,556
[45] Date of Patent: * Feb. 10, 1987

[54] TRACING ELECTRICAL CONDUCTORS BY HIGH-FREQUENCY CONSTANT-ENERGY-CONTENT PULSE LOADING

[75] Inventor: Joseph P. Pecukonis, Littleton, Colo.

[73] Assignee: Pasar, Inc., Denver, Colo.

[*] Notice: The portion of the term of this patent subsequent to Jan. 1, 2002 has been disclaimed.

[21] Appl. No.: 631,544

[22] PCT Filed: Apr. 12, 1984

[86] PCT No.: PCT/US84/00555

§ 371 Date: Jul. 10, 1984

§ 102(e) Date: Jul. 10, 1984

[87] PCT Pub. No.: WO85/04726

PCT Pub. Date: Oct. 24, 1985

Related U.S. Application Data

[63] Continuation-in-part of Ser. No. 236,050, Feb. 19, 1981, Pat. No. 4,491,785.

[51] Int. Cl.$^4$ .................. G01R 31/02; G01R 19/145
[52] U.S. Cl. .................................................. 324/67
[58] Field of Search ............... 324/51, 52, 66, 67, 324/73 PC, 326

[56] References Cited

U.S. PATENT DOCUMENTS

| | | | |
|---|---|---|---|
| 2,133,384 | 10/1938 | Fisher et al. | |
| 2,291,533 | 7/1942 | Cummings | |
| 2,651,021 | 9/1953 | Hays, Jr. | 324/52 |
| 2,789,268 | 4/1957 | Bechtel et al. | 324/66 |
| 2,993,167 | 7/1961 | Smith | 324/52 |
| 3,076,931 | 2/1963 | Jasper | 324/66 |
| 3,252,087 | 5/1966 | Parke | 324/66 |
| 3,274,489 | 9/1966 | Behr | 324/52 |
| 3,288,943 | 11/1966 | Bohnenblust | 324/66 X |
| 3,334,340 | 8/1967 | McConnell | |
| 3,427,538 | 2/1969 | Bohnenblust | 324/66 |
| 3,441,842 | 4/1969 | Strum, Jr. | 324/52 |
| 3,529,216 | 9/1970 | Kolm et al. | |
| 3,597,680 | 8/1971 | Haddon | 324/67 |
| 3,623,142 | 11/1971 | Key | 324/66 |
| 3,641,536 | 2/1972 | Prosprich | 340/203 |
| 3,810,003 | 5/1974 | Portoulas | 324/51 |
| 3,826,977 | 7/1974 | Woodworth | 324/51 |
| 3,829,765 | 8/1974 | Siler | 324/67 |
| 3,914,561 | 10/1975 | Schardt et al. | 324/66 X |
| 3,982,181 | 9/1976 | Ferony et al. | 324/66 |
| 3,991,363 | 11/1976 | Lathrop | 324/67 X |
| 4,074,188 | 2/1978 | Boatman et al. | 324/73 PC |
| 4,114,092 | 9/1978 | Fry | 324/66 |
| 4,121,152 | 10/1978 | Hale et al. | 324/66 |
| 4,129,825 | 12/1978 | Brinegar | 324/52 |
| 4,140,964 | 2/1979 | Eubank et al. | 324/54 |
| 4,227,145 | 10/1980 | Bonikowski et al. | 324/51 |
| 4,370,610 | 1/1983 | Allen et al. | 324/52 |
| 4,377,782 | 3/1983 | Metcalf et al. | 324/73 PC |

FOREIGN PATENT DOCUMENTS

1162811 8/1969 United Kingdom.

OTHER PUBLICATIONS

Locating Underground Cable Faults, *Electrical World*, Dec. 26, 1925, vol. 86, No. 26, pp. 1297–1300.

*Primary Examiner*—Gerard R. Strecker

[57] ABSTRACT

Tracing, identifying and distinguishing electrical conductors in a power distribution network energized by a varying or alternating voltage is achieved by use of a transmitter (10) which absorbs or conducts pulses of current in the power distribution network, and by a remotely located receiver (12) which detects the electromagnetic field signals corresponding to the current pulses conducted through the network conductor. The transmitter includes means (10″, 400) for varying the time width duration of each pulse of current conducted in relation to the instantaneous voltage present on the conductor during the pulse, in order to deliver pulses which are of substantially uniform and constant energy content. Discrimination of adjacent electrical conductors is enhanced because the strength of the electromagnetic field signal remains substantially constant despite the alternating or varying nature of the voltage on the distribution network.

30 Claims, 30 Drawing Figures

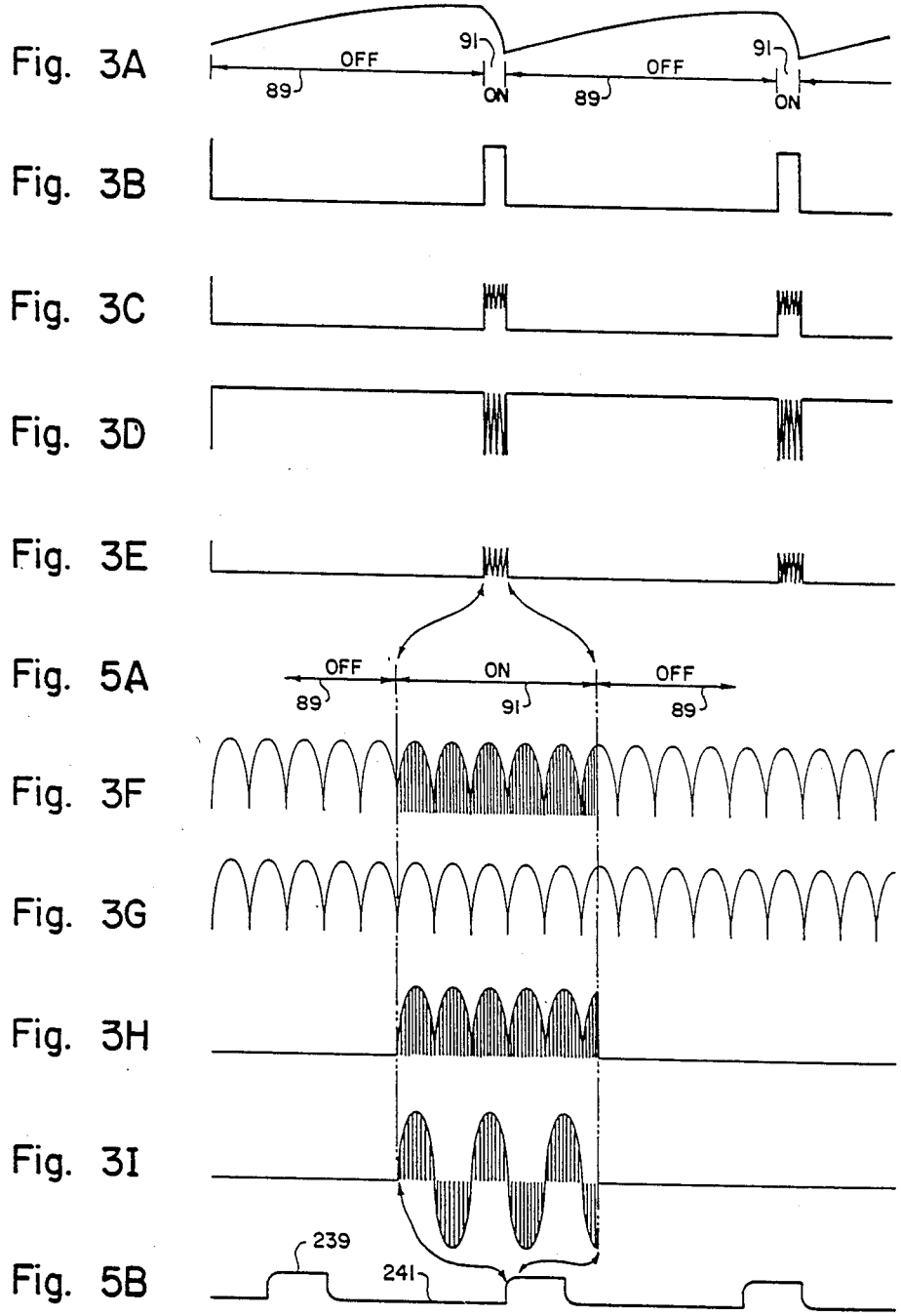

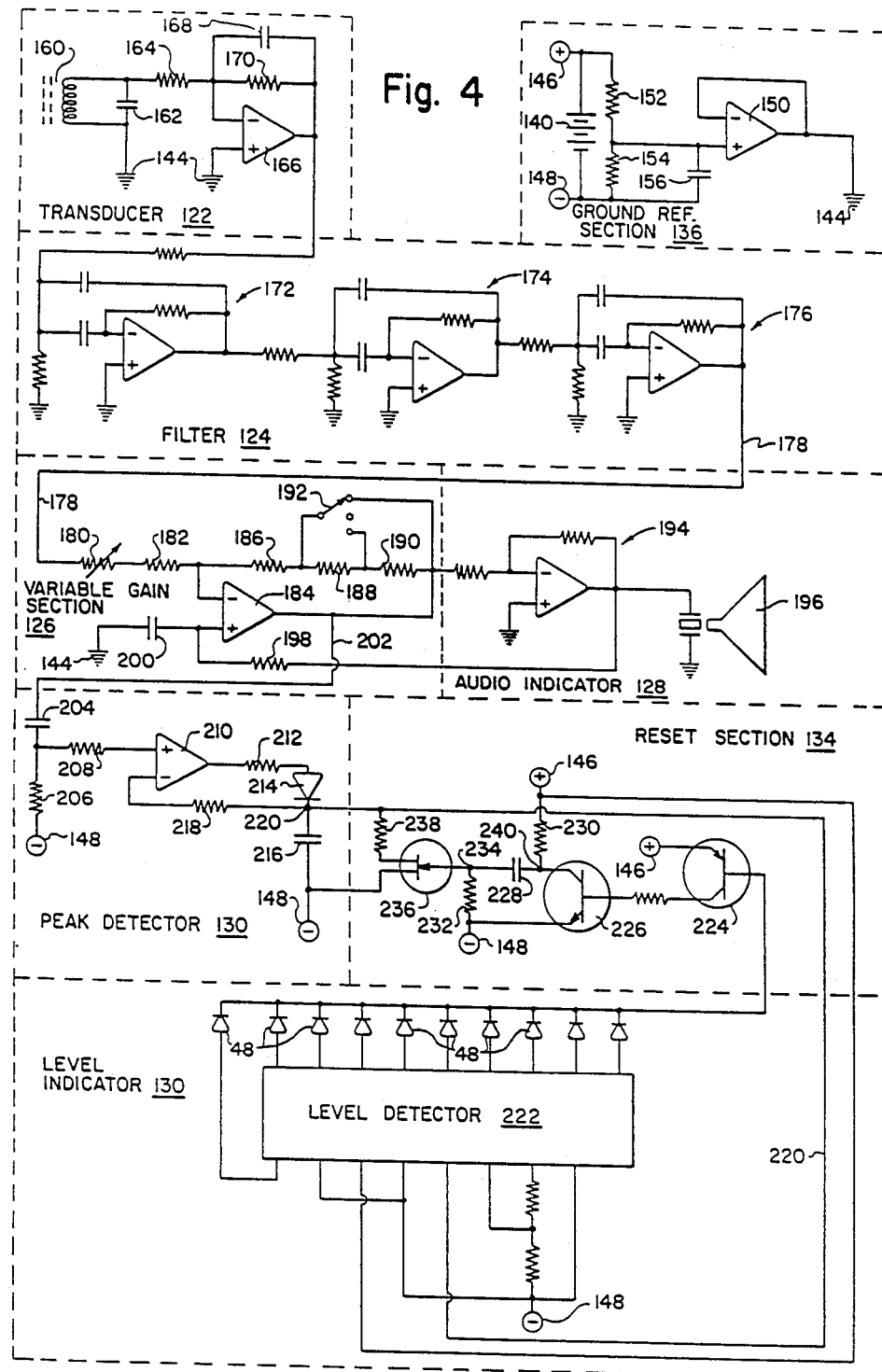

TRACING ELECTRICAL CONDUCTORS BY HIGH-FREQUENCY CONSTANT-ENERGY-CONTENT PULSE LOADING

This is a continuation-in-part of U.S. application Ser. No. 236,050 filed Feb. 19, 1981, now U.S. Pat. No. 4,491,785, for TRACING ELECTRICAL CONDITIONS BY HIGH-FREQUENCY LOADING AND IMPROVED SIGNAL DETECTION, by the inventor herein and assigned to the assignee hereof.

This invention relates to new and improved techniques for tracing electrical conductors of a power network which is conducting electrical power and is energized by an alternating or varying voltage. More specifically the present invention pertains to identifying circuit breakers, fuses, switches and other electrical current conducting or handling devices connected in the network.

It is oftentimes necessary to trace and identify particular circuits and electrical devices in a power distribution network, such as circuit breakers or fuses. Identification has typically been accomplished by practicing one or two manual techniques. One technique is to selectively disrupt power by opening the circuit breakers one at a time. When power is no longer present at the circuit, electrical device or feeder conductor in question, the opened circuit breaker identifies the item in question. The disadvantage to this technique is that electrical power is temporarily disconnected from each of the circuits and branch conductors in the course of the search, and it may be critical to maintain power to some of these circuits and branch conductors. Critical circuits include those which supply power to hospital equipment, computers, and many other types of sensitive electronic equipment. Another disadvantage is that a considerable amount of time is consumed in selectively and individually opening each of the circuit breakers. The second manual technique of identifying a circuit breaker is to introduce a sufficiently high electrical current load on the particular branch conductor to trip the circuit breaker or open the fuse. This technique is typically achieved by introducing an intentional short circuit to the branch conductor. The disadvantage of this technique is that the power will then be totally disrupted, creating the detrimental consequences previously mentioned. The increased current drawn by the short circuit can create dangerous momentary overheating or fire conditions or can cause larger trunk or distribution breakers to trip open at the same time the branch circuit breaker is tripped open. Of course, once a distribution breaker trips open, a large number of branch and distribution conductors will be disconnected from the source of electrical power.

A variety of test instruments are also available for testing and determining a variety of different electrical conditions including tracing and identifying feeder conductors, circuit breakers and other current conducting devices as well as tracing and identifying short circuited conductors. Certain of these prior devices require interruption of power to the conductors in order to accomplish the tracing and identification. Other types of prior devices employ means which cyclically create a current load on a particular conductor of sufficient magnitude to allow the increased current load, and hence the electrical device, to be identified with a conventional ammeter or impedance measuring device. Still other types of prior devices introduce a relatively high-frequency signal on the conductor while conventional power is maintained and high-frequency signal is inductively detected. The high-frequency signal detection apparatus offers the best potential for reliable circuit identification and detection, but such prior art devices are typically subject to adverse and detrimental influences, such as false indications resulting from spurious signals from transients and switching currents and reduced sensitivity for detecting and identifying the desired feeder conductors through panel enclosures and tubular conduits.

In high-frequency current-absorbing signal detection apparatus for use on energized alternating current networks, one inherent detrimental influence is a somewhat reduced capability for discrimination between closely adjacent current carrying conductors, for example adjacent circuit breakers in a breaker box, when the network carries a relatively high voltage. It has been discovered that this reduced discriminating capability is related to the radically fluctuating instantaneous voltage on the alternating current network. In most prior high-frequency current loading or absorbing tracer apparatus, high-frequency pulses of uniform time width are absorbed from the network by conducting current to a transmitter connected in the conductor circuit. The load element of the transmitter which absorbs the current is generally resistive. The magnitude of the current absorbed is therefore directly related to the instantaneous voltage during the time period that the pulse is conducted. Consequently, the amount of electrical energy or power absorbed by the pulses fluctuates in squared relation to the voltage magnitude. The strength of the induced electromagnetic field signal also fluctuates, even though its frequency remains consistent during the time that each pulse is conducted. This radically fluctuating electromagnetic signal strength has the effect of making discrimination between closely adjacent conductors very difficult. It is with respect to these and other disadvantages common to the prior high-frequency current-loading tracing apparatus that the present invention is an improvement.

SUMMARY

It is the general objective of this invention to provide a new and improved technique for tracing and identifying electrical conductors which exhibits a relatively high immunity to adverse influences from spurious signals such as transients and switching currents, which does not require the interruption of power during the testing and tracing procedures, which exhibits a relatively high selectivity for more precisely identifying and distinguishing the particular electrical circuit conductor out of a closely associated group, and which is rendered substantially insensitive to different magnitudes of voltage applied over the power distribution network.

In accordance with certain summary aspects, the present invention comprises a transmitter means and a receiver means. The transmitter means operatively conducts a predetermined waveform of electrical current through the conductors and electrical devices of the electrical power distribution network. The predetermined waveform includes a time period during which a plurality of pulses of signal current are conducted at a predetermined frequency. The pulses of current are absorbed by a load element of the transmitter means. The pulses of current in the conductor induce a corresponding electromagnetic field throughout the power distribution network along the path which supplies current to the transmitter. A receiver means inductively detects the predetermined electromagnetic field when placed in proximity with the conductor at a location remote from the transmitter means. The pulses of signal current are of predetermined approximately equal energy content, resulting in an electromagnetic field of approximately uniform strength around the conductor even as the voltage varies on the conductor. The uniform strength of the electromagnetic field makes detection of the signal carrying conductor, and discrimination of it from adjacent conductors, more readily accomplished.

The transmitter includes means for varying the time width duration of each of the current pulses conducted in relation to the instantaneous magnitude of the voltage present on the conductor during the time that the pulse is conducted. The time width duration of each of the pulses is varied in order to establish an approximately predetermined constant energy content for each of the pulses conducted. Because each of the pulses has approximately the same or uniform constant energy content, the strength of the electromagnetic field signal at the predetermined frequency remains substantially constant and independent of the fluctuating voltage on the conductor. Signal detection and discrimination is greatly enhanced because of the uniform strength of the electromagnetic field signal.

The transmitter may also advantageously include means for time centering each of the variable time width duration pulses about regular time reference intervals corresponding to the periods of the predetermined frequency. The time width centered pulses from the transmitter are advantageously detected by a digital switching filter in the receiver means. The digital switching filter of the receiver is highly effective in eliminating the adverse influences from spurious effects and signals.

The invention itself is more precisely defined in the appended claims. The improvement and concepts of the present invention are described in detail in the accompanying specification taken in conjunction with the drawings.

DRAWINGS

FIGS. 3A, 3B, 3C, 3D, 3E, 3F, 3G, 3H and 3I are waveform diagrams illustrating the operation of the transmitter shown in FIG. 2.

FIG. 4 is a schematic view of one embodiment of the receiver shown in FIG. 1.

FIG. 5A is a time line diagram showing an expanded time reference for correlating a portion of FIG. 3E to FIGS. 3F, 3G, 3H and 3I.

FIG. 5B is a waveform diagram utilizing the same time reference as employed in FIGS. 3A to 3I, illustrating the operation of the receiver shown in FIG. 4.

Figure 7:
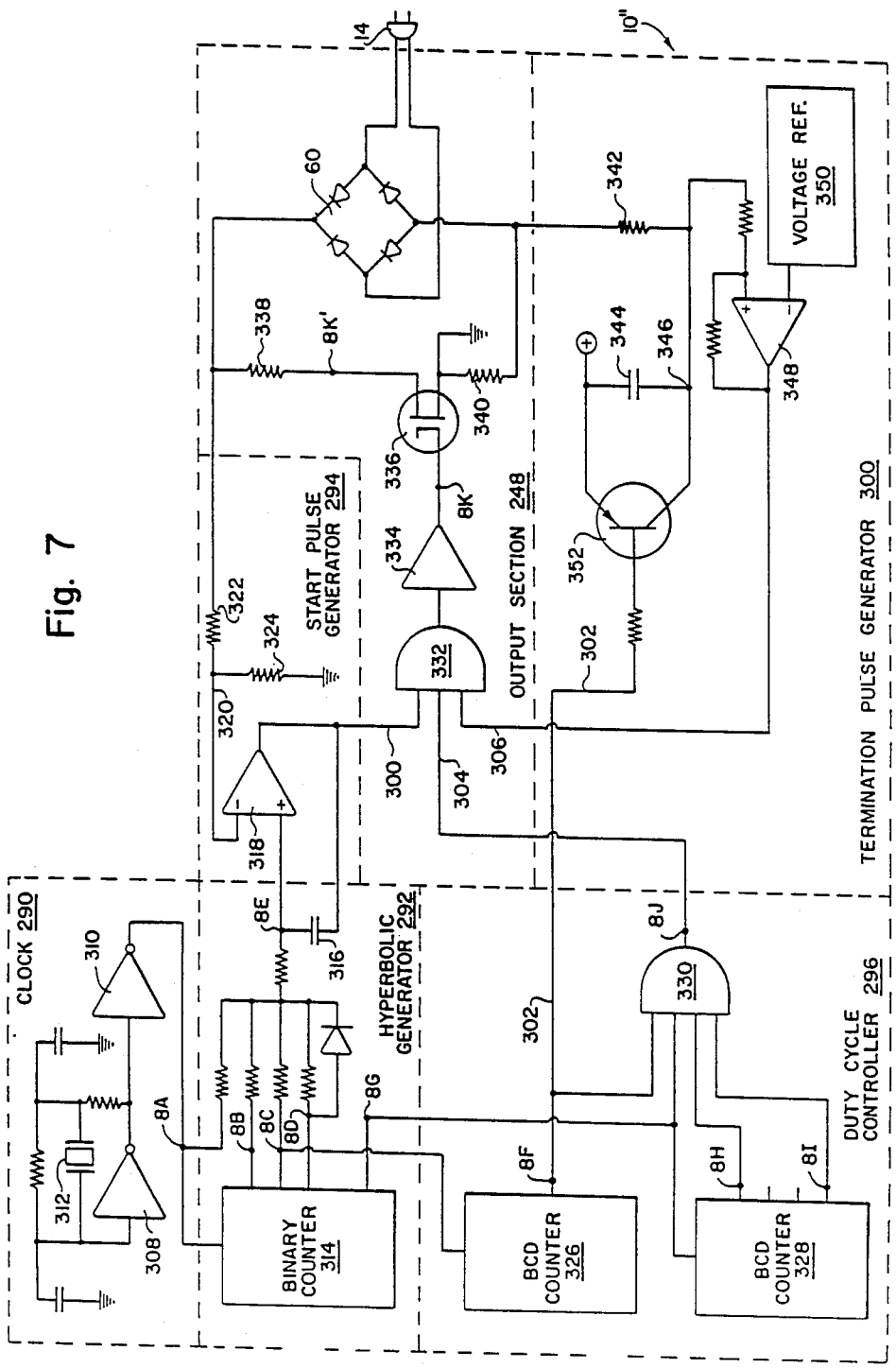
FIG. 7 is a schematic diagram of another embodiment of the transmitter shown in FIG. 1.
Figure 8A:
Figure 8B:
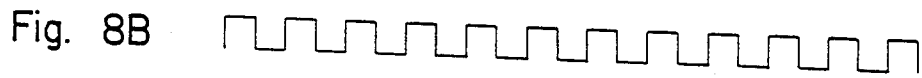
Figure 8C:
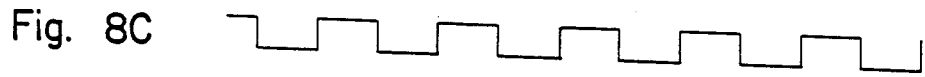
Figure 8D:
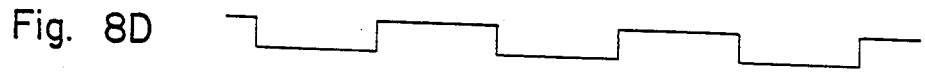
Figure 8E:
Figure 8F:
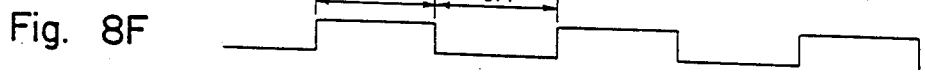
Figure 8G:
Figure 8H:
Figure 8I:
Figure 8J:
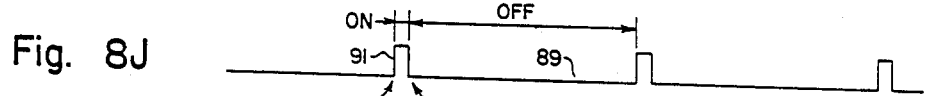
Figures 8K, 8L:
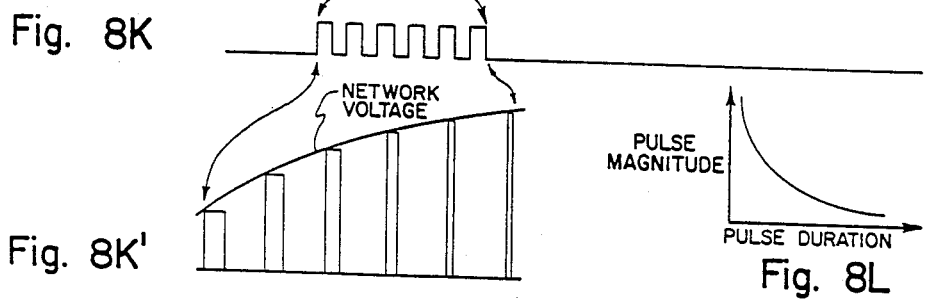

FIGS. 8A, 8B, 8C, 8D, 8E, 8F, 8G, 8H, 8I, 8J, 8K and 8K' are waveform diagrams illustrating the operation of the transmitter shown in FIG. 7, and FIG. 8L is a graph of a hyperbolic relationship of voltage magnitude and pulse width duration, which illustrates an operating principle of the transmitter shown in FIG. 7.

Figure 1:
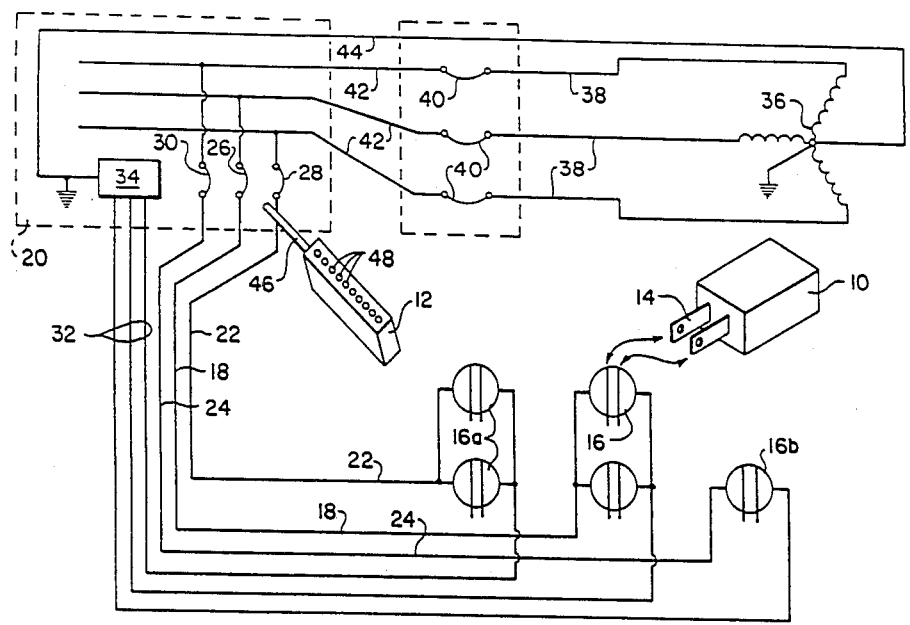
FIG. 1 is a generalized and schematic view of a transmitter and a receiver of the present invention illustrated in conjunction with a schematic electrical power distribution network.
Figure 9:
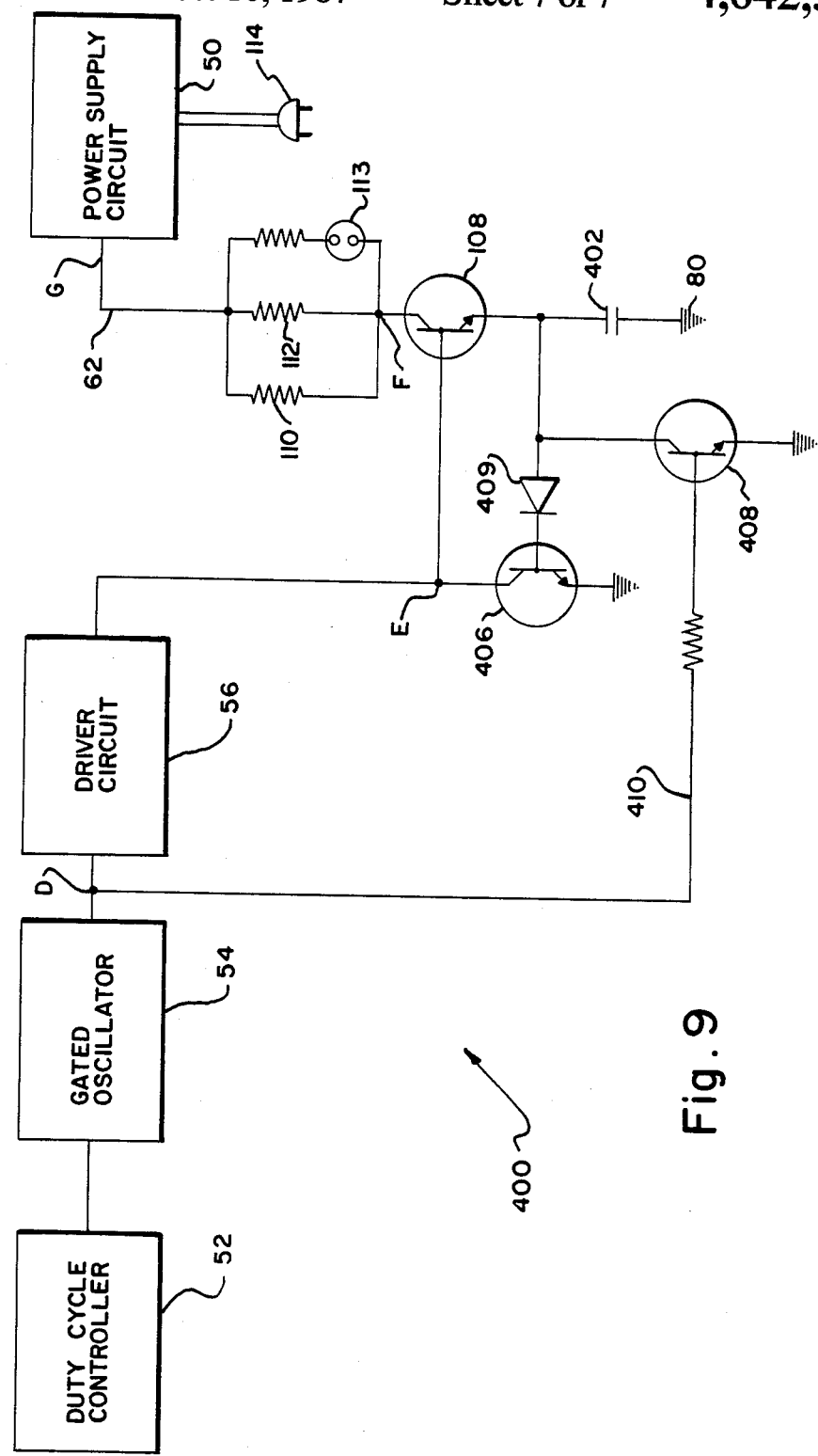

FIG. 9 is a schematic and block diagram view of another embodiment of the transmitter shown in FIG. 1.

PREFERRED EMBODIMENTS

The two basic components of the present invention are a transmitter 10 and a receiver 12 shown in FIG. 1. The transmitter 10 is electrically connected into a power distribution network through which electrical power is supplied, as by connecting a plug prong 14 of the transmitter 10 into a convenience outlet 16, for example. The convenience outlet 16 is electrically connected to a branch line or conductor 18 extending from a load center 20. Other branch lines, e.g. 22 and 24, also extend from the load center 20 and are connected with other elements such as additional convenience outlets 16a and 16b. Electrical power is supplied to the branch conductors 18, 22 and 24 through branch circuit breakers 26, 28 and 30, respectively, which are located within the load center 20. Neutral conductors 32 return current flow from the branch conductors 18, 22 and 24 to the load center at a neutral bus 34. Electrical power is supplied to the load center 20 from a secondary line transformer 36, a plurality of feeder conductors 38, a plurality of main distribution breakers 40 and a plurality of distribution conductors 42 of the power distribution network, as is typical. A ground conductor 44 also extends through the power distribution network between the secondary line transformer 36 and each neutral bus 34. The branch circuit breakers 26, 28 and 30 protect the branch conductors 18, 22 and 24, respectively, from current overload conditions by tripping open upon the occurrence of an increased current drawn through any one of the branch lines. Similarly, the main distribution breakers 40 protect the distribution conductors 42 from current overload conditions.

The transmitter 10 receives electrical power from one of the branch conductors, e.g. 18, and draws or absorbs current from that particular branch line in pattern or waveform. The predetermined pattern or current waveform drawn from the particular branch conductor to which the transmitter is connected induces a predetermined electromagnetic field directly related to the current waveform. The electromagnetic field extends along all of the branch conductors and each of the electrical devices operatively connected with these conductors. For example, when the transmitter 10 is connected into the branch conductor 18, the electromagnetic field is present at the branch conductor 18, the branch circuit breaker 26, and at one of the distribution conductors 42 and main distribution circuit breakers 40 and feeder conductors 38 electrically connected to the branch line circuit breaker 26 and over the neutral conductor 32.

The receiver 12 includes an electromagnetic field transducer means positioned at the distal end of a probe 46. The receiver 12 operatively senses the strength of the predetermined electromagnetic field, rejects substantially all other signals and operatively indicates the strength of the electromagnetic field by lighting one of a plurality of indicators 48. In this manner, branch conductors, electrical devices connected to the branch conductors, branch circuit breakers, distribution conductors, main distribution breakers, the feeder conductors and the neutral conductors can be traced and identified without interrupting the supply of power from the power distribution network.

Identification proceeds by placing the transducer means of the probe 46 adjacent each of the electrical devices in question and noting the field strength indication on the indicators 48 with respect to each. The particular electrical device exhibiting the greatest field strength indication is the device identified. As will become more apparent, the nature and operation of each transmitter 10 and receiver 12 provide an improved capability for tracing and identifying electrical devices.

Figure 2:
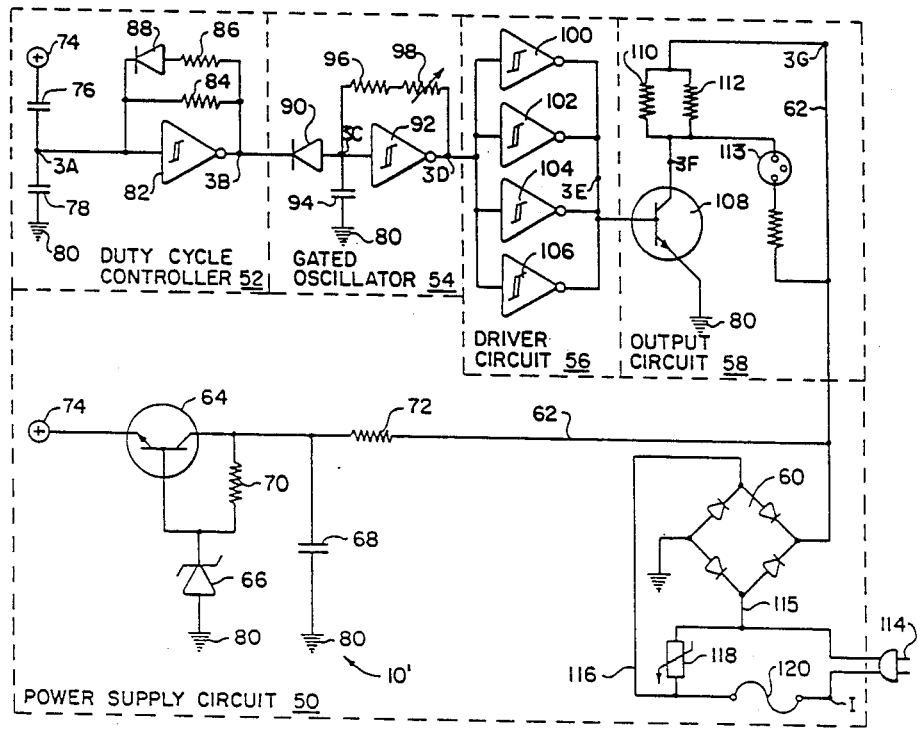
FIG. 2 is a schematic diagram of one embodiment of the transmitter shown in FIG. 1.

One embodiment 10' of the transmitter 10 is better understood by reference to FIGS. 2 and 3A to 3I. As shown in FIG. 2, the transmitter 10' comprises a power supply circuit 50, a duty cycle controller 52, a gated oscillator 54, a driver circuit 56, and an output circuit 58. The power supply circuit 50 generally draws applied AC or DC power from the power distribution network through the plug prongs 14. Alternating current power is rectified by a full wave rectifier 60 and pulsating direct current power (FIG. 3G) is applied on conductor 62 to a conventional integrating and regulating circuit comprising a transistor 64, a Zener diode 66, a capacitor 68, and the resistors 70 and 72. Regulated DC power is thereby present on terminal 74 and is conducted to other active components of the elements 52, 54, 56 and 58 of the transmitter 10'.

In the duty cycle controller 52, a pair of capacitors 76 and 78 are electrically connected in series between the terminal 74 and a ground reference 80. The input terminal to an inverting Schmitt trigger 82 is connected to the terminal 3A between capacitors 76 and 78. The output terminal 3B of the Schmitt trigger 82 is connected to the input terminal 3A through a parallel-branch feedback network comprising resistors 84 and 86 and a diode 88. The capacitors 76 and 78, the resistors 84 and 86, and the diode 88, in conjunction with the Schmitt trigger 82, form a resistive capacitive timing network of the duty cycle controller. Capacitors 76 and 78 charge and discharge at terminal 3A in accordance with the waveform diagram shown in FIG. 3A. The output waveform from the Schmitt trigger 82 at terminal 3B is illustrated in FIG. 3B. Accordingly, the two time periods established by the timing network, as shown in FIGS. 3A and 3B: a considerably longer off-time period 89, for example approximately 900 milliseconds, and a considerably shorter on-time period 91, for example approximately 45 milliseconds. The ratio of the on-time period 91 to the off-time period 89 is controlled by the ratio of the sum of the resistances of resistors 84 and 86 to the resistance of the resistor 84. The on-time period 91 and the off-time period 89 are controlled by the values of the resistors 84 and 86 in relation to the values of capacitors 76 and 78. The diode 88 operatively connects the resistor 86 in the feedback path of Schmitt trigger 82 during the on-time period 91 but eliminates the resistor 86 from the feedback path during the off-time period 89.

The gated oscillator 54 is operative during the on-time period 91 when a diode 90 connected between terminal 3B and an input terminal 3C of an inverting Schmitt trigger 92 is not conductive. A capacitor 94 is connected between terminal 3C and the ground reference 80. A resistive feedback path defined by resistor 96 and potentiometer 98 is connected between an output terminal 3D of the Schmitt trigger 92 and its input terminal 3C. When the potential of the signal at terminal 3B attains its minimum level during the off-time period 89 the diode 90 is conductive. The voltage increases on capacitor 94 until the trip point of the Schmitt trigger 92 is attained. At the trip point, the resistive feedback path of the resistor 96 and potentiometer 98 in conjunction with the capacitor 94 causes the Schmitt trigger 92 to oscillate at a frequency established by the values of the elements 94, 96 and 98, for example about 6 kHz. The frequency of oscillation can be adjusted by varying the resistance of the potentiometer 98. The oscillation occurring during the on-time period 91 is illustrated in FIGS. 3C and 3D, with FIG. 3C illustrating the input signal at terminal 3C and FIG. 3D illustrating the output signal at terminal 3D from the Schmitt trigger 92.

Four parallel-connected, inverting Schmitt triggers 100, 102, 104 and 106 primarily define the driver circuit 56. The Schmitt triggers 100, 102, 104 and 106 receive as an input signal the signal at terminal 3D shown in FIG. 3D. The Schmitt triggers of the driver circuit 56 provide added current to drive a transistor 108 of the output circuit 58. The waveform at the common output terminal 3E of the Schmitt triggers 100, 102, 104 and 106 is shown in FIG. 3E.

The output circuit 58 draws high freqency alternating current from the power distribution network when the transistor 108 is conductive. Of course, the transistor 108 conducts in accordance with the alternating high frequency current established during the on-time period 91 of the waveform, shown in FIG. 3E. When conductive, the transistor 108 operatively connects resistors 110 and 112 between the conductor 62 and the ground reference 80. Since the transistor 108 conducts in accordance with its input signal (FIG. 3E) during the on-time period 91, a high frequency current is conducted through resistors 110 and 112 as shown by the current waveform in FIG. 3H. FIG. 3G illustrates the voltage waveform present on conductor 62 and at terminal 3G. A gas indicator bulb 114 lights during the time periods that the transistor 108 is conductive and indicates the operation of the transmitter 10.

The high frequency rectified current loading shown in FIG. 3H is conducted from the full wave rectifier 60 over conductors 115 and 116 to the pronged plug 14, as the alternating waveform shown in FIG. 3I. A varistor 118, is connected between conductors 115 and 116 to protect the transmitter 10 from overvoltage conditions due to voltage transients, lightning and inductive spikes and the like and from possible improper use. A fuse 120 is connected in the conductor 116 to protect the transmitter from excessive currents.

One of the significant advantages of conducting a high frequency current loading signal from the power distribution network in the duty cycle established by the on and off time periods 91 and 89 respectively, is that the high-frequency current-conducting transistor 108 does not experience excessive heating. The extent of heating of the transistor is related to the square of the voltage at the plug prong 14 during the time when the transmitter is conductive. In a practical embodiment, the transistor 108 can conduct as much as one amp of current which, during the time the transistor is conductive, results in significant heat creation. However, by operating with a duty cycle having a significantly long off-time period 89 as compared to the on-time period 91, the average effect of the heating is greatly reduced. The relatively large current conducted during the on-time period creates an electromagnetic field of sufficient strength to be reliably detected at significantly remote locations along the conductors within the power distribution network. By not operating with a duty cycle characteristic, the strength of the field would be substantially reduced, or relatively expensive and additional components would be required to obtain comparable field strength. Accordingly, the number and cost of the elements in the transmitter is reduced, the life of the transistor 108 is prolonged and the reliability of the transmitter is enhanced.

One embodiment 12' of the receiver 12 is better understood by reference to FIG. 4. The receiver 12' includes a transducer means 122, a filter section 124, a variable gain section 126, an indicator section 128, a peak detector 130, a level indicator 132, and a reset section 134 operatively connected together. In addition, the receiver 12' includes a ground reference section 136 for maintaining the voltage reference levels of the elements of the receiver 12'.

The receiver 12' receives energy from self-contained batteries 140 and 142 of the ground reference section 136. The battery 140 is electrically connected between terminals 146 and 148 to operatively establish a positive voltage level on terminal 146 and a negative voltage level on terminal 148. The positive and negative voltage levels at terminals 146 and 148, respectively, are equally spaced above and below ground reference 144 and are maintained in the equally spaced relationship by the operational amplifier 150, the resistors 152 and 154 and the capacitor 156 connected in a known operative arrangement.

The transducer 122 is of the inductive type and utilizes an inductor or coil 160. A capacitor 162 is connected in parallel relationship with the inductor 160, and the capacitor-inductor combination is a tuned or resonant circuit with a resonant frequency equal to the frequency of the current loading pulses delivered by the transmitter 10 during the on-time period 91. A resistor 164 is connected between the coil 160 and capacitor 162 and the inverting input terminal of an operational amplifier 166. The resistor 164 reduces the effects of ringing in the tuned circuit 160 and 162 which may occur as a result of high-frequency transients that appear randomly and spuriously on the conductors of the power distribution network. A feedback loop defined by a capacitor 168 and resistor 170 is connected between the output terminal of the operational amplifier 166 and its input terminal. The values of elements 164, 168 and 170 establish the operational amplifier 166 as a low gain, low pass frequency amplifier. Accordingly, the signal inductively received by the tuned circuit 160 and 162 is amplified to a magnitude well within the range between the positive and the negative voltage supply levels established by the ground reference section 136. The values of the elements 164, 166, 168 and 170 also operatively establish a roll-off frequency point, for example about 35 kHz, at a frequency substantially higher than the high-frequency signal from the transmitter 10 but substantially less than the major high-frequency components of voltage transients and spikes. A very flat gain response is thereby obtained between the frequency of the transmitter signal and the power line frequency, typically 60 Hz. Consequently, the power line frequency will not be amplified more than the transmitter signal frequency, and the high frequency transients and spikes will be attenuated.

The filter section 124 basically comprises three serially connected filter means, 172, 174 and 176. Each of the filter means 172, 174 and 176 is an identical Sallen-Key band-pass filter of well-known circuit configuration. The component values of each Sallen-Key band pass filter are selected to provide a low Q for each individual filter, for example approximately two. As is well known, a Q is one measure of the ability of a bandpass filter to pass a particular range of frequencies. One definition of Q is the center frequency of the band pass filter divided by the frequency band width which the filter passes. Band-pass filters with high Q's are more susceptible to ringing than band-pass filters of lower Q's. During ringing a band-pass filter is rendered inoperative for its intended purpose. By placing three relatively low Q filters in series, the total Q of the filter section 124 for band-pass purposes is the sum of the Qs of each filter. For example, if each of the filters 172, 174 and 176 has an individual Q of two, the total Q of the filter section 124 is approximately six with respect to filtering the desired signal. The ability of the filter section 124 to withstand the effects of ringing from high-frequency transients is not related to its total Q, as it would be in the case of a single high Q filter. Instead, the ability to withstand ringing in the filter section 124 is related to the ability of one of the filters 172, 174 or 176 to withstand the potential for ringing. As an important result, the filter section 124 is highly selective in passing only the transmitter signal but is not highly susceptible to ringing. Accordingly, the signal present on conductor 178 is essentially a signal directed related to the high-frequency current loading created by the transmitter 10. The alternating power frequency has been selectively removed by the operational effects of the Sallen-Key filter means 172, 174 and 176. In addition, the effects of high-frequencies have been significantly attenuated by the coil 160 and capacitor 162, and by the resistive capacitive network of elements 164, 168 and 170. The three Sallen-Key band-pass filter means 172, 174 and 176 even further isolate and supply the signal created by the transmitter 10.

The signal available on conductor 178 is generally referenced positively with respect to ground 144. The positive reference results because each of the operational amplifiers of the Sallen-Key band-pass filters 172, 174 and 176 are referenced directly to ground 144 without current offsets.

It is the general function of the variable gain section 126 to amplify the signal on conductor 178 and to reference that signal midway between the positive and negative voltage levels at terminals 146 and 148. The signal on conductor 178 is applied through a potentiometer 180 and a resistor 182 to the inverting input of an operational amplifier 184. A feedback network comprising resistors 186, 188 and 190 and a multiposition switch 192 is provided to adjust the gain of the operational amplifier 184. By positioning the switch 192 in one of its three positions, one or more of the resistors 186, 188 and 190 is connected in the feedback network to control the gain. The various stages of gain provided by the feedback network accommodate different strengths of signals detected. It is apparent that the high-frequency current drawn by the transmitter 10 induces a signal strength in the conductors which diminishes in accordance with the length over which the signal is conducted, the number of elements through which the signal must be conducted and the presence of an exterior shielding enclosure. The highest gain available is when the switch 192 is open and all resistors 186, 188 and 190 are connected in the feedback loop. The highest level of gain is desirable for identifying current carrying devices in panel boxes or distribution or feeder conductors. In the medium gain setting, where resistors 186 and 190 are connected in the feedback loop, the gain is generally sufficient for tracing and identifying circuit breakers and switches. The low stage of gain, when switch 192 connects only resistor 186 in the feedback loop, is useful for detecting accessible branch conductors, for example.

With the appropriate level of gain established, the signal supplied from the output terminal of the operational amplifier 184 is supplied to an inverting input terminal of an operational amplifier 194 of the indicator section 128. The current supplied from the operational amplifier 194 drives a piezoelectric speaker 196. The speaker 196 supplies an audio signal at the frequency of the current loading signal from the transmitter 10, for example 6 kHz. This frequency of the transmitter signal is easily audibly perceived by the user as an assurance of proper identification and use of the transmitter 10 and receiver 12.

Feedback from the output terminal of the operational amplifier 194 is conducted from the audio indicator section 128 through a resistor 198 to the noninverting input of the operational amplifier 184 of the variable gain section 126. A capacitor 200 charges to the center level of the signal delivered from the operation amplifier 194. Since the operational amplifiers 184 and 194 each invert their input signals, the signal present on capacitor 200 is essentially of the same polarity as the average center level of the signal supplied to the inverting input terminal of the operational amplifier 184. Accordingly, the signal supplied at the output terminal of the operational amplifier 184 is centered with respect to the ground reference 144 and this signal is applied on conductor 202 to the peak detector section 130.

In the peak detector 130, the signal on conductor 202 passes through capacitor 204 which, in conjunction with resistor 206, changes the level of the signal on conductor 202 from being referenced to the ground reference 144 to being referenced to the negative voltage level at terminal 148. A resistor 208 is connected between the noninverting input of an operational amplifier 210 and the capacitor 204. The resistor 208 prevents current from being drawn from the capacitor 204 when the voltage on the capacitor 204 swings below the negative voltage level at terminal 148 on every other half cycle of the signal on conductor 202. Output current delivered from the output terminal of the operational amplifier 210 is conducted through a resistor 212, a diode 214 to a capacitor 216. As will become more apparent, the capacitor 216 is normally maintained in a discharged condition with respect to the negative voltage level on terminal 148. During the off-time period 89 of the transmitter signal, no signal is present on conductor 202, and the voltage signal applied to the noninverting input of the operation amplifier 210 is essentially at the negative power supply voltage at terminal 148. The output terminal of the operational amplifier 210 is also held at the negative power supply voltage of terminal 148 due to the discharged condition of the capacitor 216. The feedback resistor 218 assures that the output terminal of the operational amplifier 210 is maintained at the negative supply voltage by balancing the offset voltages produced by the operational amplifier 210 and the resistor 208.

Upon the detection of a current loading signal from the transmitter 10, the operational amplifier 210 delivers pulses of current to the diode 214 and creates a voltage level on conductor 220 which is somewhat positive with respect to the negative supply voltage 148. The resulting signal on conductor 220 creates effects in the level indicator 132 and the reset section 134 which allow the capacitor 216 to charge to a level representative of the maximum level of the current loading frequency signal with respect to the negative supply voltage. Stated another way, the voltage on capacitor 216 will be allowed to increase to one-half of the maximum peak to peak voltage of the signal present at the noninverting input terminal of the operational amplifier 210. The resistor 212 allows the voltage level on the capacitor 216 to increase at a predetermined rate and causes the voltage on capacitor 216 to reach its maximum value only after a predetermined number of complete cycles of the current loading transmitter signals have been conducted through the operational amplifier 210.

The voltage level on conductor 220 is supplied to a level detector means 222 of the level indicator section 132. The level detector 222 is a bar and dot graph integrated circuit marketed under the designation LM3914N. The level detector 222 has connected thereto a plurality of ten light-emitting diodes, each of which is referenced 48. The diodes 48 are arranged in a predetermined order along a predetermined scale. Depending upon the voltage level on the conductor 220 one of the diodes 48 will be energized. A higher voltage level on the conductor 220 will energize a light-emitting diode toward one end of the predetermined scale, and a lower voltage level will energize the light-emitting diode toward the other end of the predetermined scale. By noting the position of the light-emitting diode 48 which is energized, the relative strength of the transmitter signal is indicated. The user can determine which of the various electrical devices in close proximity to the probe 46 (FIG. 1) containing the transducer 122 is conducting the current loading signal created by the transmitter 10.

The reset section 134 operates in conjunction with the level detector 132 to periodically allow the capacitor 216 to charge to a predetermined maximum voltage, to hold the maximum voltage for a predetermined period of time, and to thereafter discharge to a condition ready for reception of another current loading signal supplied by the transmitter. The reset section 134 includes a transistor 224 which is rendered conductive when one of the light-emitting diodes 48 is energized by the level detector 222. When transistor 224 becomes conductive, it triggers transistor 226 into conduction. Normally, transistor 226 is not conductive and capacitor 228 has charged through resistors 230 and 232 to a voltage level present between the positive supply voltage 146 and the negative voltage 148. A terminal 234 of the capacitor 228 thereby achieves a voltage approximating the negative supply voltage at terminal 148. The terminal 234 is connected to the gate terminal of a field effect transistor 236. The source terminal of the transistor 236 is also connected to the negative supply voltage 148. When the gate terminal voltage and the source terminal voltage are approximately equal, the transistor 236 becomes conductive to discharge the capacitor 216 through resistor 238. The transistor 236 remains conductive only during the time period that a signal is not present on conductor 220, i.e. when transistors 224 and 226 are not conductive. However, when transistor 224 becomes conductive under the condition of a signal being applied to conductor 220 and one of the light-emitting diodes 48 becomes conductive, the terminal 240 of capacitor 228 is operatively connected to the negative supply voltage at terminal 148. The voltage at terminal 234 immediately goes to a level substantially below the negative supply voltage at terminal 148 which causes the transistor 236 to become nonconductive. The capacitor 216 commences charging and continues to charge so long as the voltage at terminal 234 remains below the voltage at the negative supply voltage at terminal 148. This condition exists for a sampling time period 239, shown in FIG. 5B, the length of which is determined by the discharge period established by the values of the resistor 232 and capacitor 228. The time period 239 is substantially greater than the on-time period 91 of the transmitter signal but less than the off-time period 89 of the transmitter signal (FIGS. 3E and 8J). Accordingly, the capacitor 216 is in condition to charge to its maximum level during the time period 89 that the transmitter 10 creates the current loading signal. For false spurious signals of short duration and of frequency comparable to the transmitter frequency, resistor 212 is conductive only momentarily and capacitor 216 does not attain a significant level to operatively result in a discernably intelligible indication at the light-emitting diodes 48 before the false signal dissipates.

The maximum voltage level to which capacitor 216 is charged is maintained during the sampling time period 239. The maximum charge level is maintained on conductor 220 for a sufficient period of time 239 to allow the level detector 222 to energize the appropriate light-emitting diode 48 and indicate the maximum attained transmitter signal strength. By holding the voltage level on conductor 220 for the sample time period 239, a constant indication is available from one of the diodes 48 for an amount of time sufficient for intelligent observation. After the sampling time period 239 ends, the transistor 236 again becomes conductive and the capacitor 216 is immediately discharged through resistor 238. In the discharged condition during a reset time period 241, the receiver awaits the reception of another current loading transmitter signal during the on-time period 89. Once the first cycle of the transmitter signal is conducted through the receiver 12' in the manner described, the capacitor 216 again starts charging to the maximum level during the sample period 239. After the appropriate light-emitting diode 48 has been energized to indicate the maximum attained transmitter signal strength, represented by the voltage level on conductor 220 and across capacitor 216, the capacitor 216 is again discharged during the reset time period 241. During the reset time period 241, the capacitor 228 recharges to the voltage level between the positive and negative supply terminals 146 and 148, respectively. The length of the reset time period 241 is established by the values of the capacitor 228 and the resistors 230 and 232.

From the foregoing description, it is apparent that the receiver 12' operates during the sample time period 239 to indicate the presence and strength of the transmitter signal. The detected signal is effectively filtered by an improved filtering arrangement to eliminate or reduce the influence of spurious signals such as voltage transients. Occasional spurious signals which may be coupled through the receiver to the diodes 48 remain only for a short period of time due to the lack of significant effects from false signals and/or the relatively short sample and reset periods of operation provided by the reset section 134. Any false or spurious signals are quickly eliminated from consideration because they do not continually cause the repeated energization of the same or approximately the same light-emitting diode, as would occur upon detection of a constantly applied transmitter signal of the same signal strength. Accordingly, not only does the receiver 12' utilize improved filtering techniques to eliminate many of the adverse effects of spurious signals, but its indication of the strength of the transmitter signal has the effect of substantially further eliminating various adverse effects. By causing the sample period 239 to be considerably longer than the on-time period 91 of the transmitter signal, a sufficient time frame is established whereby one group of current loading transmitter pulses will be detected and their signal strength established. By making the sample period 239 less than the off-time period 89 of the transmitter signal, only one signal group from the transmitter will have an operative effect on the receiver 12. By making each period of receiver opertion (the sum of periods 239 and 241) less than the period of the transmitter duty cycle (the sum of periods 89 and 91), the receiver will be in condition to respond to each new signal supplied by the transmitter. Accordingly, the improved filtering and sampling effects of the receiver assure high transmitter signal sensitivity and improved immunity to the effects from spurious signals, to a degree which has heretofore been unavailable in the field of tracing and identifying electrical conducting devices.

Figure 6:
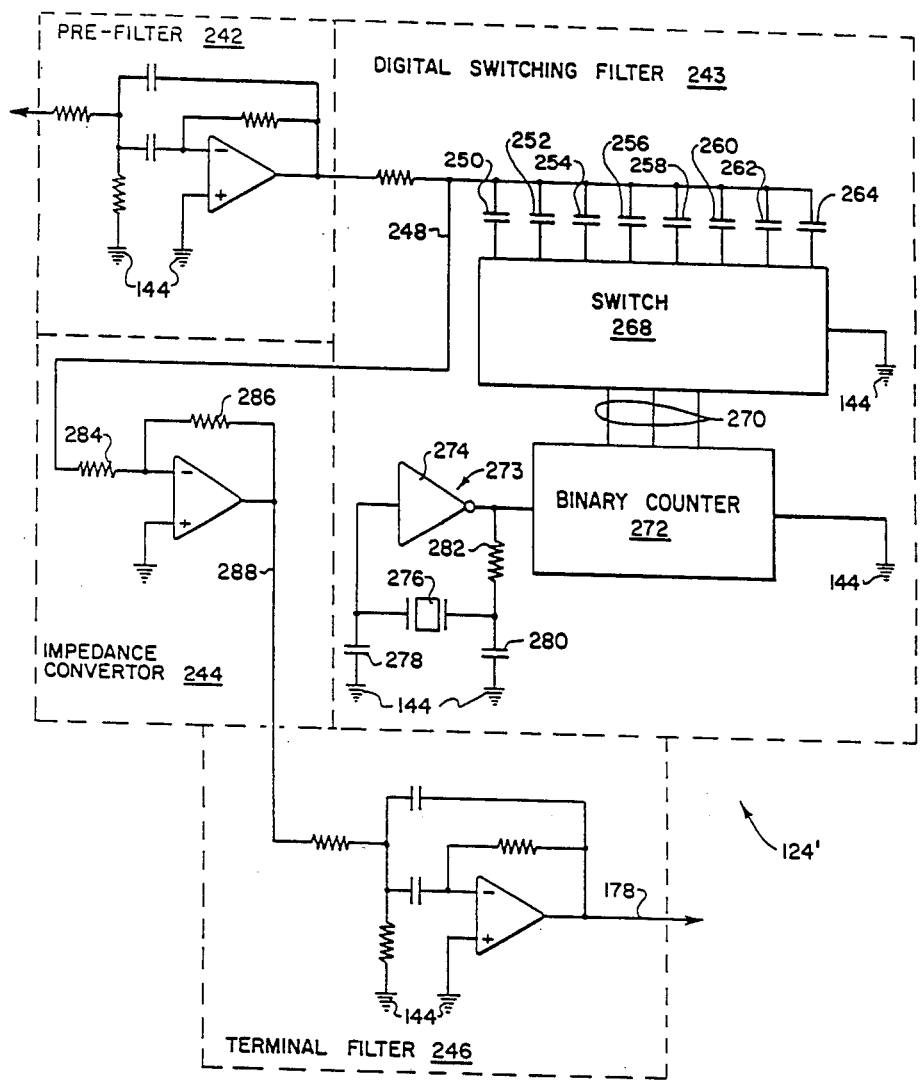
FIG. 6 is a schematic diagram of an alternative portion of the receiver shown in FIG. 4.

Another embodiment of an improved receiver can be understood by reference to FIG. 6. The elements illustrated in FIG. 6 are an alternative to the Sallen-Key band-pass filter means 172, 174 and 176 employed in the filter section 124 of the receiver 12' shown in FIG. 4. The function of the elements shown in FIG. 6 is to provide more improved filtering than that available from the technique of serially connecting a plurality of relatively low Q band-pass filters. An even more improved and enhanced sensitivity and ability to reliably detect the transmitter signal results.

The improved filter section 124' shown in FIG. 6 includes a prefilter means 242, a digital switching filter means 243, and impedance converter means 244 and a terminal filter means 246. The prefilter 242 takes the form of a typical Sallen-Key band-pass filter which employs resistive and capacitive component values selected to primarily reduce the typical alternating current power frequency, i.e. 60 Hz, and other low frequencies to an acceptable level for preventing unnecessary influences on the digital switching filter 243. The digital switching filter 243 has the capability of allowing only signals of a very narrow preselected main band-pass frequency to remain on conductor 248, as well as very low frequencies and harmonics of the main band-pass frequency. The other signals on conductor 248 are in essence coupled to ground 144 and are not passed to the impedance converter 244. Signals of a spurious or random nature are therefore essentially coupled to ground since such signals typically do not fall within the low frequency range or the precise narrow primary band-pass frequency range or harmonics of the primary band-pass frequency. In essence, the digital switching filter 243 will pass signals having a consistent repetitious phase angle relative to the phase angle of the signals of the primary band-pass frequency.

The digital switching filter 242 comprises a plurality of capacitors 250, 252, 254, 256, 258, 260, 262 and 264 which are connected between the conductor 248 and the eight output terminals of a one-of-eight input select switch 268. The switch 268 functions to connect one of its output terminals to which the capacitors 250–264 are connected, to the ground reference 144. The one of the output terminals which is connected to ground is selected by a binary signal supplied on conductors 270. While the selected input is connected to ground reference 144, the remaining other inputs are disconnected from ground reference and are allowed to float, thereby not providing a conduction path through those other inputs to the ground reference. A binary counter 272 supplies signals on the conductors 270. A clock signal is supplied to the clock terminal of the binary counter 272 from an oscillator 273, which comprises an inverting operational amplifier 274, a crystal 276, capacitors 278 and 280 and a resistor 282. The predetermined operational frequency of the oscillator 273 is established and is very precisely regulated by the characteristics of the crystal 276. The oscillator frequency supplied to the clock input terminal of the binary counter 272 is an exact predetermined multiple of the predetermined narrow band-pass frequency of the digital switching filter 243, with the predetermined multiple being equal to the number of output terminals of the switch 268 to which capacitors are connected. For example, if the primary band-pass frequency of the digital switching filter is 6 kHz, the frequency of the clock pulses supplied by the oscillator 273 to the clock terminal of the binary counter 272 is 48 kHz.

For signals at the primary band-pass frequency of the digital switching filter 243, each of the capacitors 250-264 will charge or integrate over one-eighth of each cycle of the signal. Each capacitor will eventually charge to a level equal to an average applied signal level during its conduction interval. Thereafter, when a current conduction path exists through each of the capacitors 250-264 during its conduction interval, the voltage level previously established on that capacitor is essentially equal to the voltage level present on conductor 248 during that time interval. The voltage level or signal on conductor 248 is thereby unaffected since the switching of the capacitor 250-264 to ground reference 144 does not adversely shunt the signal level on conductor 248 to ground. However, for signals which are not in phase with the primary band-pass frequency or its harmonic multiples, each of the capacitors 250-264 will charge to randomly different levels during the intervals when they are connected individually to the ground reference 144. Accordingly, since there will be no similarity of the signal levels on the capacitors 250-264 relative to the applied signal on conductor 266 during the subsequent conduction intervals, a substantial portion of the signal on conductor 248 will be shunted to ground 144 or will be smoothed by the effect of the capacitors 250-264 discharging to or from the conductor 248. The end result is that all signals other than the primary band-pass frequency or its exact multiples are substantially attenuated on conductor 248.

The impedance converter 244 essentially buffers the impedance of the digital switching filter 243 with respect to the terminal filter 246. The impedance converter 244 also provides a desired amount of gain established by its feedback resistor 286. The signals which are allowed to pass from the digital switching filter 243 on the conductor 248 are passed through the impedance converter 244 on conductor 288 to the terminal filter 246.

The terminal filter 246 essentially comprises another typical Sallen-Key band-pass filter, the primary function of which is to attenuate any switching noise included with the signal on conductor 288. The terminal filter 246 also attenuates any harmonic frequency components that may be included with the signal. The terminal filter supplies its signal on conductor 178, to the other elements of the receiver 12' shown in FIG. 4. The receiver 12' otherwise functions in the manner previously described.

Due to the precise frequency passage characteristics of the digital switching filter 243, a highly reliable means for filtering or attenuating all spurious signals except the predetermined transmitter signal is achieved. Operation of the receiver 12 is thereby rendered even more immune to spurious signals, transients and potential ringing. The receiver 12 becomes even more reliable in identifying and tracing electrical devices which conduct the predetermined transmitter signal.

A transmitter 10" shown in FIG. 7 includes circuit elements functioning to deliver constant energy content current loading pulses to the power distribution network. The desirable result available from transmitting constant energy content current loading signal pulses is that the detected electromagnetic signals have approximately the same signal effect on the receiver 12 irrespective of the magnitude of the instantaneous voltage on the power distribution network. The end result is that the receiver 12 will exhibit approximately the same sensitivity for signals from the transmitter 10", regardless of the point in time in the alternating power supply cycle that the signal pulses are delivered, and even in power distribution networks with different voltages.

The energy content of a pulse is determined by its magnitude or voltage and its time width or duration. Specifically, the energy content is equal to the integral of the magnitude of the pulse over its time duration. FIG. 8L indicates the hyperbolic relationship of magnitude and duration to obtain a pulse of predetermined constant energy content. It is apparent that if the magnitude varies, for example, the duration must be adjusted accordingly to obtain the constant energy pulse. In the specific application described herein, the voltage magnitude of the transmitter pulse will vary continuously due to the alternating nature of the applied voltage over the power distribution network, and because the transmitter and receiver may be utilized in conjunction with power distribution networks in which different voltage levels are present. It is one of the functions of the transmitter 10" to modulate the time duration of the pulses in accordance with the constant energy hyperbolic relationship by utilizing the instantaneous voltage at approximately the time when the pulse is initiated as an independent variable.

Constant energy current loading pulses create beneficial effects at the resonant or tuned circuit defined by the inductor 160 and capacitor 162 of the transducer 122 of the receiver 12 (FIG. 4). It has been discovered that a tuned circuit will integrate signals applied to it, and the output signal of the tuned circuit is the product of integrating the signal level with time, so long as the duration of the applied pulse signal does not exceed the time period of a half wave at the resonant frequency. Upon applying constant energy pulses, the output signal from the tuned circuit is of constant magnitude at the resonant frequency. The constant output signal obtains a more reliable, accurate and sensitive indication from the receiver.

The output signal from a tuned circuit will essentially be a sine wave even though the input signal is a pulse wave. Assuming a positive going input pulse, the sine wave supplied from the resonant circuit will be in a phase relationship with the input pulse such that the center point (ninety degree phase position) of the positive going half wave of the sine wave output will be centered about the center point of the input pulse. Since the transmitter 10" will be delivering constant energy pulses of different magnitude and pulse width durations, it is important to consistently deliver the current loading pulses from the transmitter 10" at consistent time intervals equal to the period of the transmitter frequency to consistently reinforce the sine wave established in the resonant circuit in a consistent phase relationship. Since the current loading pulses will be pulse width modulated, the initial leading edges of these pulses from the transmitter 10" will vary slightly with respect to the time center point of each pulse delivered, and of course, the time center point of each delivered pulse will be desirably positioned at the equal intervals of the transmitter frequency.

The hyperbolic relationship set forth in FIG. 8L also describes in proportional terms the time at which the leading edge of a pulse is to be initiated relative to a center reference at the center of the time duration of pulses of various widths. This proportionality relationship exists because the first half of the pulse will also possess constant energy characteristics, and the width of the first half of the pulse is established by the leading edge of the pulse relative to the pulse center point.

The transmitter 10", shown in FIG. 7, includes circuit elements for achieving the above discussed considerations. The transmitter 10" comprises a clock 290, a hyperbolic generator 292, a start pulse generator 294, a duty cycle controller 296, an output section 298 and a termination pulse generator 300. The clock 290 generally delivers frequency and timing signals for achieving proper operation of the transmitter 10". The hyperbolic generator 292 supplies a curve approximating a hyperbolic function, and the hyperbolic curve is utilized in establishing the point at which the leading edge of the current loading pulse will be delivered from the transmitter 10" so as to result in the centering of each current loading pulse at time intervals equal to the period of the transmitter frequency. The start pulse generator 292 delivers a signal on conductor 300 for initiating the leading edge of the current loading pulse. The duty cycle controller 296 achieves two important functions. One function is to limit the duration of each current loading pulse to a time not exceeding one half of the period of the transmitter frequency. A safety signal delivered over conductor 302 achieves this function. The second function is to establish the overall duty cycle of the transmitter 10". A signal delivered over conductor 304 establishes the duty cycle from the transmitter 10". Upon occurrence of the signals on conductors 300, 304 and 306, the output section 298 begins delivering current loading signal pulses to the power distribution network by absorbing power through the plug prong 14. The current loading pulses are of constant energy content, limited in pulse width duration to no greater than one half the period of the transmitter frequency, and are limited to the predetermined duty cycle established by the on-time 91 and off-time 89 (FIGS. 3A and 8J). After the initiation of each individual pulse, the termination pulse generator 300 integrates the magnitude of the voltage of the particular pulse width time, and delivers a termination pulse on conductor 306 when the constant energy content is attained. The termination pulse on conductor 306 operatively terminates the pulse from the output section 298. Thereafter, the transmitter 10" delivers the next constant energy pulse which is time centered with respect to the next time interval equal to the period of the transmitter frequency.

The clock 290 comprises a pair of inverters 308 and 310, a crystal 312 and capacitors and resistors connected in a manner to obtain a square wave clock signal (FIG. 8A) of predetermined frequency. The clock signal is supplied from the clock 290 on the conductors leading from terminal 8A. The frequency of the clock signal is a predetermined even multiple of the transmitter frequency. In the exemplary arrangement shown in FIG. 7, the clock frequency is eight times the desired transmitter frequency.

The hyperbolic generator 292 includes a binary counter 314 which receives the clock signal. The first three divide-by-two output terminals 8B, 8C and 8D of the counter 314 divide the clock signal and supply the pulse waveforms shown in FIGS. 8B, 8C and 8D, respectively. The signal on terminal 8D (FIG. 8D) establishes the transmitter frequency. The clock signal on terminal 8A and the signals on terminals 8B, 8C and 8D are applied through resistors to an integrating capacitor 316. When the signals on terminals 8A, 8B, 8C and 8D are high, the current is delivered to the capacitor 316 and the voltage thereacross is integrated. The resulting voltage across capacitor 316, present at terminal 8E, approximates a hyperbolic curve and is illustrated in FIG. 8E. The hyperbolic curve shown in FIG. 8E is established once during each initial half wave of the transmitter frequency square wave present at terminal 8D.

The start pulse generator 294 includes an operational amplifier 318 which receives a signal representative of the hyperbolic curve shown in FIG. 8E on its noninverting input terminal 8E. On the inverting input terminal, the comparitor 318 receives a signal on conductor 320 representative of the instantaneous voltage on the power distribution network. The signal on conductor 320 is obtained from the full wave rectifying bridge 60 which is connected through the plug prong 14 to the power distribution network. The resistors 322 and 324 reduce the magnitude of the applied power signal on conductor 320 to a level generally commensurate with and proportional to the magnitude of the hyperbolic curve signal. When the voltage of the hyperbolic curve signal on terminal 8E slightly exceeds the voltage on conductor 320, the output of the operational amplifier 318 goes high and the start signal is applied on conductor 300. Because the power distribution voltage is compared to the hyperbolic curve signal, the time relationship of the leading edge of the current loading pulse relative to the magnitude of the applied voltage is established, as previously described in conjunction with FIG. 8L. The current loading pulse is initiated at a time whereby the resulting center point of the pulse will occur coincidentally with the same reference or phase point in each cycle of the transmitter signal, and that pulse center point will occur approximately at the positive-going edge of the pulses shown in FIG. 8D. In this manner the transmitter pulses, even though variable in duration, are centered in time with respect to a consistent reference point or phase angle of each cycle of the transmitter signal. The result is that the tuned circuit of the receiver transducer detects the constant energy pulse electromagnetic fields at consistent points in time to best reinforce and continue the resonance established by the prior pulses supplied by the transmitter.

The duty cycle controller 296 includes binary counters 326 and 328. The binary counter 326 is positive edge triggered while the counters 314 and 328 are negative edge triggered. The signal on terminal 8C is applied to the enable input of the counter 326. The signal on terminal 8C is a square wave having a frequency twice that of the transmitter frequency, as can be seen by comparing FIGS. 8C and 8D. Because the counter 326 is positive edge triggered, an output signal from the first divide-by-two output terminal connected to conductor 302 is a signal shown in FIG. 8F, and that signal is approximately ninety degrees delayed in phase from the transmitter frequency signal shown in FIG. 8D. The signal on conductor 302 is a safety signal and is operatively utilized for limiting the maximum pulse duration of the current loading pulses delivered by the transmitter 10″ to no greater than one half of the period of the transmitter frequency period. The signal on conductor 302 is applied as one input to the AND gate 330.

The function of the binary counter 328 of the duty cycle controller 296 is to establish the overall transmission duty cycle for the transmitter 10″. Input signals to the counter 328 are taken from the twelfth divide-by-two output terminal 8G of the binary counter 314 and are shown in FIG. 8G. The on-time period of the square wave shown in FIG. 8G establishes the on-time period 91 of the transmitter duty cycle shown in FIG. 8J. Output signals from the counter 328 are supplied on the first divide-by-two output terminal 8H and the eighth divide-by-two output terminal 8I. The signal on terminal 8I, shown in FIG. 8I, is operative to establish the overall time period for each duty cycle from the transmitter 10″.

The signals on terminals 8F, 8G, 8H and 8I are supplied as inputs to the AND gate 330. A high signal from the output terminal 8J of the AND gate 330 is present on conductor 304 upon the coincidence of four high input signals to the AND gate 330, and this signal is shown in FIG. 8J. During the on-time period 91, the transmitter is allowed to deliver constant energy content current loading pulses to the power distribution network, as shown in FIGS. 8K and 8K′. During the off-time period 89 of the signal shown in FIG. 8J, the transmitter does not deliver signals. This arrangement, as described previously, greatly increases the power conducting capability, without detrimental heating.

An AND gate 332 receives the signals present on conductors 300, 304 and 306. As will be understood subsequently, the signal on conductor 306 is a normally high signal. The signal on conductor 300 is the start signal for initiation of the current loading pulse. The signal on conductor 304 is a signal which limits the time duration of current loading pulses. Upon receipt of three high signals on the conductors 300, 304 and 306, the AND gate 332 delivers a high trigger signal to the amplifier 334. The high signal, applied on the terminal 8K, biases a V-mos power transistor 336 to conduct current through a power resistor 338 to the ground reference. The current conducted through the power resistor 336 is reflected through the full wave bridge 60 to the power distribution network, in the manner previously described.

In order to terminate the current loading pulse after a sufficient time duration has lapsed in accordance with the magnitude of the pulse to obtain a constant energy content, the termination pulse generator 330 becomes operative to reduce the signal level on conductor 306 from a previous high level to a low level, thereby operatively terminating the bias signal to the transistor 336. When transistor 336 is conducting, resistor 340 applies approximately one half of the power network voltage to resistor 342. Capacitor 344 is charged through resistor 342. The resistor 342 and capacitor 344 act as an integrator and the voltage at terminal 346 is proportional to the energy content of each current loading pulse on an instantaneous basis. The voltage at terminal 346 is applied to the noninverting input terminal of an operational amplifier comparitor 348. The voltage level of a reference 350 is applied to the inverting input terminal of the operational amplifier 348. The voltage established by the reference 350 is of a magnitude equal to the voltage across capacitor 344 at terminal 346 when the predetermined constant energy content of each current loading pulse is attained. When the voltage at terminal 346 reaches a level below that of the reference 350, the signal on conductor 306 goes low, thereby terminating the pulse when the predetermined constant energy content has been achieved. The signal on conductor 302 biases the transistor 352 to prevent integration by the capacitor 344 except during times when the safety signal (FIG. 8F) is high. The maximum pulse width duration of the pulse is limited to a half-wave of the transmitter frequency, or fifty percent, thereby keeping within the limitation over which the resonant circuit will be effective for integration.

The transmitter 10″ thereby delivers constant energy content pulses over the power distribution network irrespective of the voltage applied to the power distribution network. The pulses occur over time periods which are centered at regularly occurring reference intervals equal to the period of the transmitter frequency. The duration of each pulse is limited to a predetermined portion of each cycle of the transmitter frequency, and the transmission of signals from the transmitter is limited to a predeteremined duty cycle. The effect at the receiver 12 is that an approximately constant level signal is available from the transducer and variations in the voltage of the power distribution network will not create false signals which might otherwise falsely indicate an incorrect electrical device sought to be identified. Although the transmitter 10″ has been described primarily in conjunction with a use for tracing and identifying electrical conductors in a power distribution network, the previously described advantageous concepts of the transmitter 10″ may be utilized in other applications as well.

In order to achieve reliable detection of constant-energy-content pulses by a receiver which employs a digital switching filter, such as that receiver 124′ shown in FIG. 6, a transmitter must have the capability of centering the variable-time-width pulses with respect to regular reference time intervals corresponding to the periods of the transmitter frequency. The transmitter 10″ shown in FIG. 7 has such a capability. However, for receivers which use regular passive filter elements such as those shown in FIG. 4, an improved signal detection and discrimination capability is obtained by conducting constant-energy-content pulses from the network even though such pulses are not necessarily exactly consistently centered at regular time reference intervals corresponding to the periods of the transmitter frequency.

A transmitter 400 shown in FIG. 9 employs a reduced number of components, as compared with the transmitter 10″ (FIG. 7) to achieve improved signal discrimination between adjacent conductors, for example circuit breakers in a circuit box, as a result of delivering variable time-width constant-energy-content pulses which are commenced at regular time reference intervals corresponding to the periods of the transmitter frequency. Hence each pulse is not necessarily exactly centered about regular time intervals corresponding to the periods of the transmitter frequency. The transmitter 400 may be used with a receiver, such as that shown in FIG. 4, which does not employ a digital switching filter.

The transmitter 400 employs the duty cycle controller 52, the gated oscillator 54, the driver circuit 56, and the power supply circuit 50 which have previously been discussed in conjunction with the transmitter shown in FIG. 2. In addition the power plug prong 114, through which current pulses are conducted from the network, and the power switching transistor 108 are also employed. When the current switching means or transistor 108 is rendered conductive by a trigger signal from the driver circuit 56 applied at terminal E, current is conducted through the two load resistors 110 and 112, and the indicator bulb 113 lights to indicate operation of the transmitter 400. Electrical current from the network is conducted from the plug 114 through the bridge circuit (reference 60 in FIG. 2) to terminal G, and power is absorbed by the load resistors 110 and 112.

In order to provide variable-time-width duration constant-energy-content pulses each time the switching transistor 108 is rendered conductive, an integrating means such as capacitor 402 is connected between the emitter of the transistor 108 and reference potential 80. When the transistor 108 is conductive, the voltage on capacitor 402 increases in relation to the time integration of the current flowing through the transistor 108 and the load elements between terminals F and G. When the voltage level on capacitor 402 increases to a predetermined amount greater than the sum of the forward conduction voltages of the diode 409 and the emitter-base junction of transistor 406, transistor 406 is biased into conduction. Terminal E at the base of transistor 108 is pulled down to a voltage level closely approximating the reference voltage 80, and the receipt of the trigger signal at the base of transistor 108 is terminated. The conduction of transistor 108 ceases and the pulse terminates, thus establishing the time width of the pulse.

Since the amount of current flowing through the load elements connected between points F and G is directly related to the voltage on the network at the time that the transistor 108 is conductive, the voltage across capacitor 402, being the integration of current with respect to time, represents the energy content of the pulse. The sum of the forward conduction voltages of the diode junctions of the diode 409 and the base-emitter junction of transistor 406 defines a predetermined reference voltage. This reference voltage represents a predetermined amount or content of energy of the pulse, when the sum of the forward conduction voltages is compared to the voltage across capacitor 402. Once the voltage across capacitor 402 increases above the reference voltage, the transistor 406 becomes conductive to terminate further current conduction by the transistor 108. In this manner transistor 108 conducts current during each pulse period for a variable time period related to the instantaneous voltage on the conductor of the network to which the plug 114 is connected, until a pulse of predetermined constant-energy-content has been absorbed from the network. Each pulse of current thus conducted and absorbed by the transmitter 400 is a constant-energy-content pulse having variable-time-width related to the voltage on the network during the pulse duration.

The conduction of each constant-energy-content pulse commences at a predetermined a regular reference interval determined by the cycle controller 52 and the gated oscillator 54. Each energy pulse absorbed therefore commences at a regular interval, but the time duration of the pulse may be variable from one pulse to the next depending upon the network voltage. The end result is that the time center locations of each of the variable-time-width pulses may be vary slightly with respect to the reference intervals at the transmitter frequency, but this slight variance is not significantly important except when a digital switching filter type of receivers (e.g., FIG. 6) is used in conjunction with the transmitter.

The integrating capacitor 402 must be discharged after each pulse has been conducted, so that during the next subsequent pulse current may be integrated to obtain a constant-energy-content pulse. Transistor 408 is connected in parallel with capacitor 402 in order to discharge capacitor 402 to reference potential 80. The base of transistor 408 is connected by conductor 410 to terminal D. The signal at terminal D is the signal which, when inverted and amplified by the driver circuit 56, causes transistor 108 to initially commence conducting. When the signal at terminal D is low the driver circuit 56 applies a high trigger signal to transistor 108 and the transistor 408 is non-conductive. During the time period when the signal present at terminal D is high, the conductor 410 applies a high signal to transistor 408 thereby causing it to conduct and discharge capacitor 402. Accordingly the transistor 408 is one example of means for discharging the integrating capacitor 402 during the non-conductive periods of the transistor 108 after each pulse has been conducted. Transistor 408 will also maintain a conductive condition during the off-time period of the transmitter duty cycle.

On relatively high voltage networks, without employing a transmitter which absorbs constant-energy-content pulses from the network, it is difficult to distinguish between adjacent conductors and circuit breakers on a reliable basis, because the electromagnetic signals are of such strength that identification and distinguishment of adjacent conductors becomes difficult or impossible. As a comparative example, a transmitter which conducts constant width unregulated pulses will create an electromagnetic field signal four times greater in strength than a constant-energy-content pulse transmitter, when both transmitters are used on a network energized with voltage two times greater than a reference voltage, for example, 220 volts rather than 110 volts. When the electromagnetic field signal is that much stronger it is difficult to isolate one specific conductor from a plurality of closely adjacent ones because of the more persuasive nature of the increased strength signal.

The significant advantages and improvements available from the embodiments of the transmitter and receiver of the present invention have been described. The specificity of description has, however, been made by way of example. The invention itself is defined by the scope of the appended claims.

What is claimed is:

1. Apparatus for tracing and identifying an electrical current carrying conductor or similar means in an electrical network which is energized with a varying voltage and which is carrying current therethrough at a power frequency, comprising in combination:

transmitter means for connection to said conductor and for conducting electrical signal current through said conductor in repetitious transmission cycles, each transmission cycle being defined by a predetermined waveform having a predetermined time period during which a plurality of pulses of signal current are conducted through said conductor at a predetermined frequency, the signal current pulses being of sufficient magnitude to induce about said conductor a predetermined electromagnetic field signal having a frequency characteristic corresponding to the predetermined frequency at which signal current pulses are conducted during said predetermined time period, said transmitter means further including means for varying the time width duration of each of said signal current pulses in a predetermined relation to the voltage present on said conductor during the time of conduction of each said signal current pulse to establish a predetermined approximately constant energy content for each signal current pulse conducted during said predetermined time period; and receiver means, operative when placed in proximity of said conductor at a location remote from said transmitter means, for detecting the predetermined electromagnetic field signal and for distinguishing the predetermined electromagnetic field signal from other signals which may be present about said conductor and for indicating the relative strength of the detected electromagnetic field signal.

2. Apparatus as defined in claim 1 wherein said transmitter means further comprises:

means operatively connected to said conductor for generating a signal representative of the instantaneous voltage present on said conductor; and means responsive to the signal representative of the instantaneous voltage, for varying the time width duration of each signal current pulse in predetermined relation to the signal representative of the instantaneous voltage to establish each signal current pulse with the approximately constant energy content.

3. Apparatus as defined in claim 2 wherein said transmitter means further comprises:

means for substantially time-centering each said constant-energy-content signal current pulse at predetermined regular reference time intervals, each of said reference time intervals occurring at and corresponding to periods of the predetermined frequency.

4. Apparatus as defined in claim 3 wherein said transmitter means further comprises:

start generator means for initiating each signal current pulse at a start time relative to said reference interval according to a predetermined hyperbolic relationship of voltage magnitude and pulse width; and termination generator means operative upon initiation of each said signal current pulse for integrating a signal representative of the voltage on said conductor with respect to time and for operatively terminating the signal current pulse upon the integration reach a value corresponding to the predetermined constant energy content of each signal current pulse.

5. Apparatus as defined in claim 4 wherein said start generator means of said transmitter means further comprises:

means for generating a signal representative of the predetermined hyperbolic relationship during each period at the predetermined frequency at which signal current pulses are delivered; and means for comparing the signal representative of the hyperbolic relationship with the signal representative of the instantaneous voltage on said conductor to establish the start time relative to the reference interval.

6. Apparatus as defined in claim 1 wherein said transmitter means comprises:

means for generating a first signal representative of a predetermined hyperbolic relationship of voltage magnitude and time from a leading edge of the signal current pulse to a center point in the time duration of the total width of the signal current pulse resulting in the predetermined constant energy content for the signal current pulse;

means for supplying a second signal representative of the instantaneous voltage magnitude on said conductor;

means for supplying a third signal representative of a predetermined regular time reference interval established by the period of the predetermined frequency of said transmitter means;

means for comparing the first and second signals for delivering a fourth signal upon one of the first or second signals exceeding the other of the first or second signals; and means receptive of the third and fourth signals for initiating conduction of the signal current pulse at a point in time relative to the occurrence of the third signal.

7. Apparatus as defined in claim 6 wherein said transmitter means further comprises:

means responsive to the initiation of the conduction of said signal current pulse for supplying a fifth signal at the initiation of the conduction of each of said signal current pulses; and means responsive to the fifth signal for integrating a signal representative of the instantaneous voltage magnitude over time and for terminating the conduction of the signal current pulse upon the integration attaining a value representative of the predetermined constant energy content of said signal current pulse.

8. Apparatus as defined in claim 7 wherein said transmitter means further comprises:

duty cycle control means for establishing a repetitious duty cycle having an on-time period during which the conduction of the pulse is initiated and terminated and having an off-time period during which no pulses are delivered, each said duty cycle having a time duration corresponding to the time between subsequent reference intervals.

9. Apparatus as defined in claims 3 or 6 wherein said receiver means further comprises a digital switching filter means operative for detecting a signal having a frequency characteristic corresponding to the predetermined frequency of the electromagnetic field.

10. Apparatus as recited in claim 9 wherein said digital switching filter means further comprises:

a plurality of phase capacitors;

selectable switch means having a plurality of output terminals and at least one switch select input terminal and at least one reference terminal, said selectable switch means operatively connecting a selected one of the output terminals to the reference terminal, the selected one of the output terminals being designated in accordance with signals at each switch select terminal, each output terminal being connected to a different phase capacitor; and oscillator means for supplying a periodic signal at a predetermined oscillator frequency, the predetermined oscillator frequency being essentially an even multiple of the predetermined frequency of said pulses; and counter means receptive of the signal from said oscillator means and operative for supplying signals representative of the count of the oscillator signal to the switch select terminals.

11. Apparatus as defined in claim 1 wherein said transmitter means further comprises load means electrically connected to said conductor, and wherein said means for varying the time width duration of said signal current pulses further comprises:

means for supplying a periodic trigger signal;

current switching means electrically connected to said load means and responsive to said trigger signal for conducting the signal current pulses from said conductor through said load means upon receipt of the periodic trigger signal;

integrating means connected to said current switching means and operative for integrating current conducted through said load means during each said signal current pulse, said integrating means further generating a signal related to the integration of the pulse current during time;

means supplying a reference signal representative of the predetermined constant energy content of each signal current pulse; and means receptive of the integration-related signal and the reference signal for terminating the receipt of the trigger signal by said current switching means upon the integration-related signal achieving a predetermined relationship with respect to said reference signal.

12. Apparatus as defined in claim 11 wherein:

said switch means comprises a controllable transistor switch through which current from said load means is conducted upon application of the trigger signal; and said integration means comprises a capacitor operatively connected to integrate the current flowing through said load means with respect to time and thereby derive a related voltage signal;

said reference signal supplying means supplies a reference voltage signal; and said trigger signal terminating means further comprises a second transistor switch which conducts the trigger signal from said first transistor switch upon becoming conductive upon the voltage derived by the capacitor increasing above the reference voltage.

13. Apparatus as defined in claim 12 wherein said transmitter means further comprises:

capacitor discharge means operatively connected to said capacitor for periodically discharging the voltage from said capacitor after each signal current pulse is terminated and before the next subsequent signal current pulse is initiated.

14. Apparatus as defined in claim 13 wherein said transmitter means operatively conducts said plurality of pulses of signal current during a first predetermined time period of the periodic waveform and during a second predetermined time period of said waveform conducts no pulses of signal current, said transmitter means further comprising:

duty cycle control means for operatively establishing the first and second predetermined time periods and for supplying an energizing signal during the first predetermined time period; and gated oscillator means electrically connected to said duty cycle control means and receptive of the energizing signal for supplying the trigger signal with an oscillating characteristic at the predetermined frequency during the first predetermined time period.

15. Apparatus as defined in claim 1 wherein:

said transmitter means operatively conducts the plurality of pulses of signal current at the predetermined frequency during a first predetermined time period of each said waveform and conducts no signal current pulses during a second predetermined time period of each said waveform; and said receiver means is operative on a periodic repetitious duty cycle basis to indicate the relative strength of the electromagnetic field signal detected during a first predetermined time period of each receiver duty cycle and does not provide any indication during a second predetermined time period of the receiver duty cycle.

16. Apparatus as defined in claim 15 wherein the first predetermined time period of the receiver duty cycle is greater than the first predetermined time period of the transmitter waveform, and the first predetermined time period of the receiver duty cycle is less than the second predetermined time period of the transmitter waveform.

17. Apparatus as defined in claim 16 wherein the total time of each transmitter waveform is different than the total time of each receiver duty cycle.

18. Apparatus for tracing and identifying an electrical current carrying conductor or similar means in an electrical network which is energized with a varying voltage and which is carrying current therethrough at a power frequency, comprising in combination:

transmitter means for connection to said conductor and for conducting electrical signal current through said conductor in repetitious transmission cycles, each transmission cycle being defined by a predetermined waveform having a predetermined time period during which a plurality of pulses of signal current are conducted through said conductor at a predetermined frequency, the signal current pulses being of sufficient magnitude to induce about said conductor a predetermined electromagnetic field signal having a frequency characteristic corresponding to the predetermined frequency at which signal current pulses are conducted during said predetermined time period, said transmitter means further including means for selectively conducting current in the conductor to establish a predetermined approximately constant energy content for each signal current pulse, the predetermined approximately constant energy content of each signal current pulse being established in response to the current conducted in the conductor due to the signal current pulse and the time width duration of the signal current pulse; and receiver means, operative when placed in proximity of said conductor at a location remote from said transmitter means, for detecting the predetermined electromagnetic field signal and for distinguishing the predetermined electromagnetic field signal from other signals which may be present about said conductor.

19. Apparatus as defined in claim 18 wherein the predetermined approximately constant energy content of each signal current pulse is established from an integral relationship of the current conducted by the transmitter means during the signal current pulse and the time width duration of the signal current pulse.

20. Apparatus as defined in claim 19 wherein said transmitter means further comprises load means eletrically connected to said conductor, and wherein said means for selectively conducting current in the conductor to establish each signal current pulse of the predetermined approximately constant energy content further comprises:
  means for supplying a periodic trigger signal;
  current switching means electrically connected to said load means and operatively responsive to said trigger signal for conducting the signal current pulses from said conductor through said load means upon receipt of the periodic trigger signal; and
  integrating means connected to said current switching means and operative for integrating current conducted through said load means during each signal current pulse.

21. Apparatus as defined in claim 20 wherein said transmitter means operatively conducts said plurality of pulses of signal current during a first predetermined time period of the periodic waveform and during a second predetermined time period of said waveform conducts no pulses of signal current, said transmitter means further comprising:
  duty cycle control means for operatively establishing the first and second predetermined time periods and for supplying an energizing signal during the first predetermined time period; and
  gated oscillator means electrically connected to said duty cycle control means and receptive of the energizing signal for supplying the trigger signal with an oscillating characteristic at the predetermined frequency during the first predetermined time period.

22. Apparatus as defined in claim 19 wherein:
  said transmitter means operatively conducts the plurality of pulses of signal current at the predetermined frequency during a first predetermined time period of each said waveform and conducts no signal current pulses during a second predetermined time period of each said waveform; and
  said receiver means is operative on a periodic repetitious duty cycle basis to indicate the relative strength of the electromagnetic field signal detected during a first predetermined time period of each receiver duty cycle and does not provide any indication during a second predetermined time period of the receiver duty cycle.

23. Apparatus as defined in claim 22 wherein said receiver means further comprises a digital switching filter means operative for detecting a signal having a frequency characteristic corresponding to the predetermined frequency of the electromagnetic field.

24. Apparatus as defined in claim 21 wherein said transmitter means draws the signal current pulses from the conductor to which the transmitter means is connected.

25. Apparatus as defined in claim 18 wherein said means for selectively conducting current to establish each signal current pulse of a predetermined approximately constant energy content operatively responds to the voltage on the conductor during the time duration of the signal current pulse to establish the predetermined approximately constant energy content.

26. Apparatus as defined in claim 25 wherein the predetermined approximately constant energy content of each signal current pulse is established from a hyperbolic relationship of the voltage on the conductor and the time width duration of the signal current pulse.

27. Apparatus as defined in claim 26 wherein said transmitter means operatively conducts said plurality of pulses of signal current during a first predetermined time period of the periodic waveform and during a second predetermined time period of said waveform conducts no pulses of signal current, said transmitter means further comprising:
  duty cycle control means for operatively establishing the first and second predetermined time periods and for supplying an energizing signal during the first predetermined time period; and
  gated oscillator means electrically connected to said duty cycle control means and receptive of the energizing signal for supplying the trigger signal with an oscillating characteristic at the predetermined frequency during the first predetermined time period.

28. Apparatus as defined in claim 25 wherein:
  said transmitter means operatively conducts the plurality of pulses of signal current at the predetermined frequency during a first predetermined time period of each said waveform and conducts no signal current pulses during a second predetermined time period of each said waveform; and
  said receiver means is operative on a periodic repetitious duty cycle basis to indicate the relative strength of the electromagnetic field signal detected during a first predetermined time period of each receiver duty cycle and does not provide any indication during a second predetermined time period of the receiver duty cycle.

29. Apparatus as defined in claim 28 wherein said receiver means further comprises a digital switching filter means operative for detecting a signal having a frequency characteristic corresponding to the predetermined frequency of the electromagnetic field.

30. Apparatus as defined in claim 29 wherein said transmitter means draws the signal current pulses from the conductor to which the transmitter means is connected.

* * * * *